US006529064B2

(12) United States Patent
Hachmeister

(10) Patent No.: US 6,529,064 B2
(45) Date of Patent: Mar. 4, 2003

(54) METHOD AND DEVICE FOR CONTROLLING AN ELECTRICAL LOAD

(75) Inventor: Marcel Hachmeister, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/953,355

(22) Filed: Sep. 17, 2001

(65) Prior Publication Data

US 2002/0145463 A1 Oct. 10, 2002

(30) Foreign Application Priority Data

Sep. 16, 2000 (DE) ........................................ 100 45 976

(51) Int. Cl.[7] ........................................ H03K 3/42
(52) U.S. Cl. ........................................ 327/513; 327/512
(58) Field of Search ........................................ 327/512, 513, 327/551, 552

(56) References Cited

U.S. PATENT DOCUMENTS 4,745,571 A * 5/1988 Foster ........................ 700/299
5,910,751 A * 6/1999 Winn et al. ................. 327/513
6,414,832 B1 * 7/2002 Crecelius et al. ........... 361/120

FOREIGN PATENT DOCUMENTS

DE 196 06 965 8/1997

* cited by examiner

*Primary Examiner*—Toan Tran
(74) *Attorney, Agent, or Firm*—Kenyon & Kenyon

(57) ABSTRACT

A method and a device for controlling an electrical load. A quantity is ascertained which is a function of the temperature of the load or which characterizes the temperature of the load. The quantity is specifiable on the basis of a temperature variable and a current variable. A first filter takes into account the influence of the temperature variable on the quantity, and a second filter takes into account the influence of the current flowing through the load.

8 Claims, 2 Drawing Sheets

METHOD AND DEVICE FOR CONTROLLING AN ELECTRICAL LOAD

BACKGROUND INFORMATION

German Patent No. 196 06 965 describes a method and a device for controlling the metering of fuel into an internal combustion engine. In the case, a solenoid valve is used as an electrical load in order to control the fuel metering. The temperature of the fuel is inferred on the basis of the resistance of the solenoid-valve coil. The current and the voltage applied to the coil are evaluated for ascertaining the resistance of the coil.

This patent does not take into consideration the energy exchange between the solenoid valve and the surroundings and/or between the solenoid valve and the medium flowing through the solenoid valve.

SUMMARY OF THE INVENTION

It is advantageous when, for ascertaining a quantity which is a function of the temperature of the load or which characterizes the temperature of the load, a first filter is used which takes into account the influence of a temperature variable on the quantity, and a second filter is used which takes into account the influence of the current flowing through the load. The procedure is particularly advantageous when ascertaining the coil temperature and/or the coil resistance of a solenoid valve. These variables can be ascertained with little expenditure. Thus, only a few sensor signals are needed which are already partially needed for the control of the load. The ambient air temperature is used in particular as the temperature variable.

A particularly precise simulation of the time behavior of the variables results when the first and/or the second filter has/have at least PT1 behavior.

The quantity, which is a function of the temperature of the load or which characterizes the temperature of the load, is the temperature or the ohmic resistance of the load. In particular, it is the temperature or the ohmic resistance of a coil of a solenoid valve.

A precise simulation of the resistance and/or of the temperature results by taking into consideration the intrinsic heating of the load, which is simulated by the second filtering means. The current flowing through the load is preferably used as the initial basic parameter of the modeling. In this context, the desired current value and/or the measured current value can be utilized.

A particularly advantageous simulation of the behavior of the load, particularly with a view to the possibly energy exchange with the surroundings and/or the medium flowing through the load, results when the first filter includes at least two parallel-connected filters with PT1 behavior, and when the parallel-connected filters have different time behavior. In this context, preferable a measured temperature value for the ambient temperature and/or the temperature of the medium flowing through the load is/are used as initial basic parameter(s) for the modeling.

DETAILED DESCRIPTION

In the following, the procedure of the present invention is described, using the determination of the temperature of a solenoid valve as an example. Such solenoid valves are used in motor vehicles chiefly for controlling the fuel quantity to be injected or for controlling a liquid and/or gaseous medium. Thus, for example, pressure regulators are used for regulating the pressure in hydraulic systems such as in the case of a transmission-shift control and/or for systems which influence the braking action of individual and/or all wheels.

For precise control of these loads, particularly for monitoring the loads, the electrical resistance and thus the temperature of the load should be known.

Figure 1:
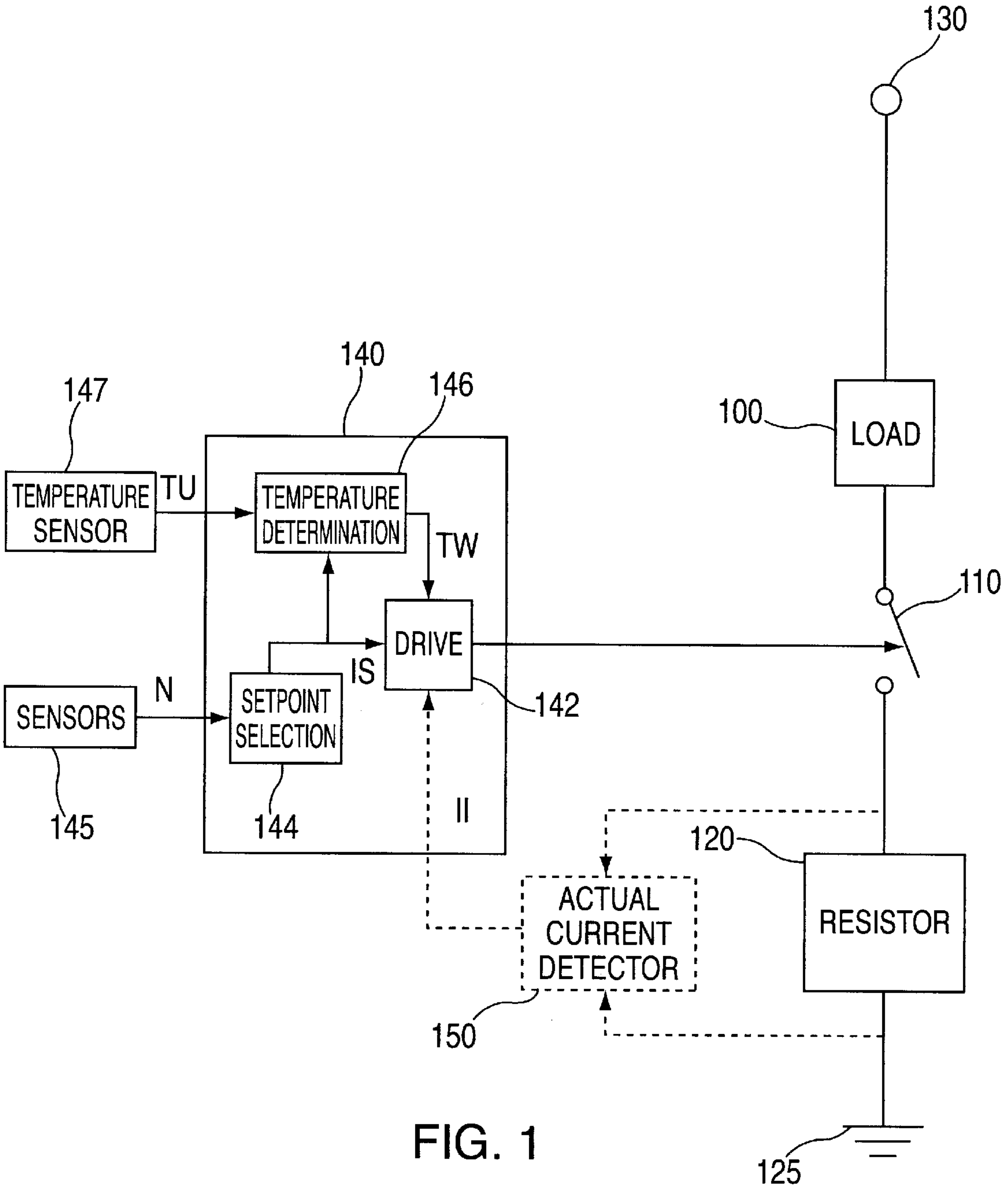
FIG. 1 shows a block diagram and a device for controlling an electrical load.

FIG. 1 shows, by way of example, such a device for controlling a load. The load is designated by 100 and is connected to a grounded connection 125 via a series connection composed of a switching element 110 and a resistor 120. The load is also contacted to a supply voltage 130. In the case of a motor vehicle, this voltage supply is preferably the vehicle electrical system, i.e. a battery.

Switching element 110 preferably receives triggering signals from a control 140. Control 140 includes essentially a drive circuit 142 which acts upon switching element 110 with triggering signals. Drive 142 receives a current setpoint IS from a setpoint selection 144, and a temperature value TW, which characterizes the temperature of the load, from a temperature determination 146. The output signal IS of the setpoint selection also arrives at temperature determination 146. Output signal TU of a temperature sensor 147 is also supplied to temperature determination 146. Setpoint selection 144 is supplied with various signals from different sensors 145 which characterize the operating state and/or environmental conditions that are needed for controlling the load. They include, for example, the speed of an internal combustion engine when load 100 is used in an internal combustion engine.

In one particularly advantageous refinement, provision can be made for drive 142 to contain a current regulation. In this case, the voltage drop at resistor 120 is picked off by an actual-current detector 150 and is supplied as actual value II to drive 142.

On the basis of various operating parameters, as a function of which load 100 is to be driven, setpoint selection 144 determines a current setpoint IS which is ascertained in such a way that the load takes a predetermined position in response to this current flow. For example, the current value is determined such that the load, which, for instance, is designed as a solenoid valve or pressure regulator, adjusts a specific pressure value. Drive 142 converts this setpoint value IS into triggering signals for switching element 110, which is then driven in corresponding manner by drive 142. For example, in this context, switching element 110 can be driven with a corresponding pulse duty factor or with a correspondingly pulse-width-modeled (modulated) signal.

For instance, if the load is a solenoid valve, then the resistance is essentially determined by the winding of the solenoid valve. This resistance is strongly dependent on temperature TW of the winding. To enable a precise control of the load, it is therefore necessary that winding temperature TW be taken into account when forming the triggering signals for switching element 110. To that end, temperature determination 146 determines temperature TW of the coil winding on the basis on the basis of the current which is flowing through the load and further influences such as ambient temperature TU.

In the exemplary embodiment shown, setpoint current IS is used for this. In an alternative specific embodiment, it is also possible to use actual current II, which is ascertained with the aid of resistor 120 and the current determination. Furthermore, other variables characterizing this quantity can also be used.

Figure 2:
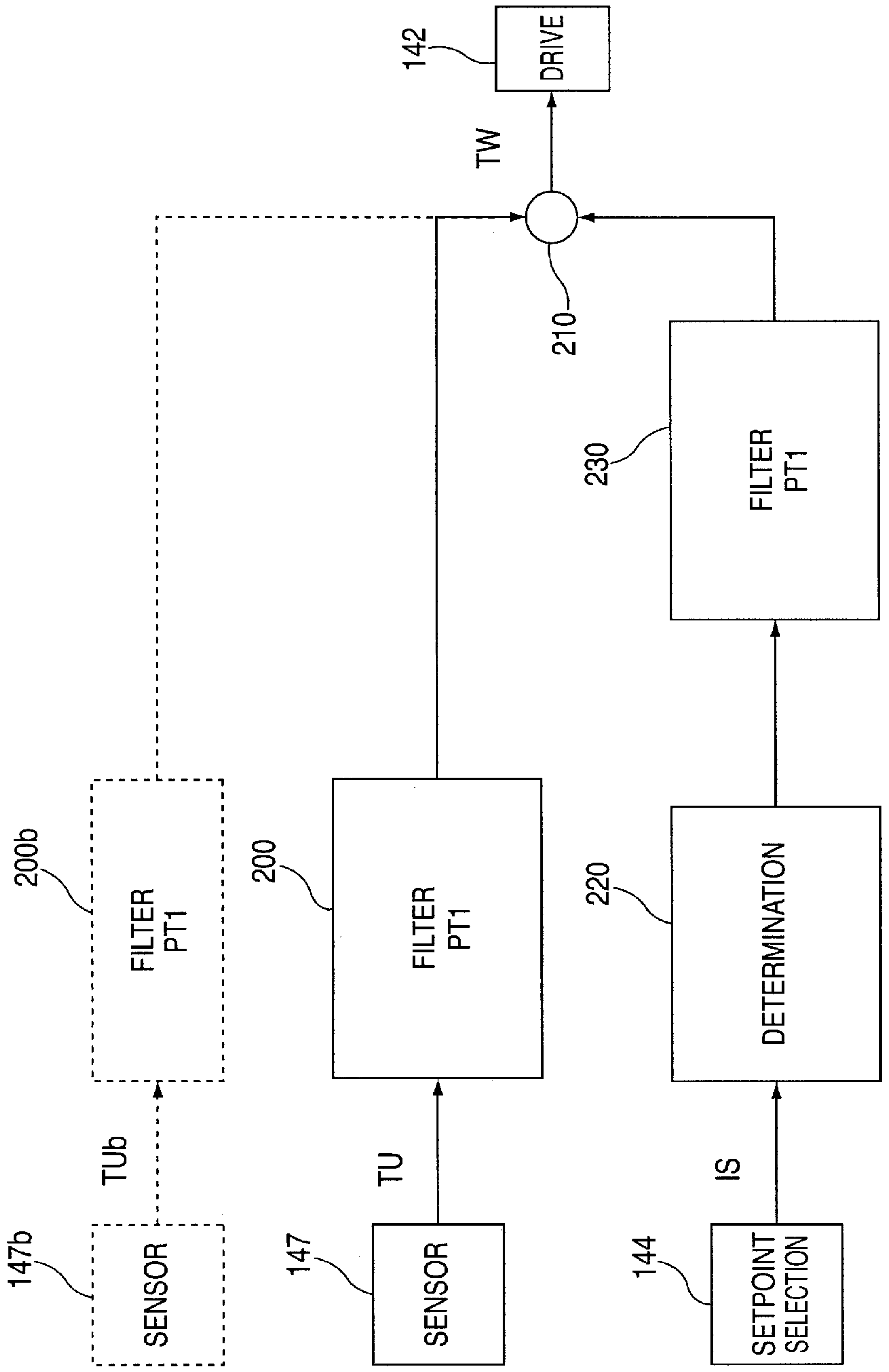
FIG. 2 shows a block diagram for the purpose of illustrating the determination of the temperature of an electrical load.

FIG. 2 shows temperature determination 146 in detail. Elements already described in FIG. 1 are marked with corresponding reference numerals. Signal TU with respect to the ambient air temperature arrives, via a first filter 200, at a node 210. A signal characterizing the current flowing through the load arrives, via a power determination 220, at a second filter 230. In the specific embodiment shown, the output signal of setpoint selection 144 is used as such a signal. The output signal of filter 230 arrives at node 210. Node 210 gates the two signals, preferably additively, and routes the result as coil temperature TW to drive 142.

In a particularly advantageous refinement, a signal TUb with respect to the ambient air temperature from a sensor 147*b* arrives, via a further filter 200*b*, at node 210.

The first filter preferably has PT1 behavior. This filter 200 is designed in such a way that it allows for the influence of the ambient temperature on coil temperature TW. Second filter 230 takes into account the influence of current IS flowing through the load on the coil temperature. To this end, the electric loss power which arises in the load is determined on the basis of the current flowing through the load. This loss power is essentially proportional to the square of current IS. Power determination 220 and filter 230 simulate the intrinsic heating of the load due to the current flow. The first filter simulates the heat exchange between the surroundings and the coil winding.

Winding temperature TW thus ascertained describes the actual winding temperature very accurately, since the important influences such as intrinsic heating due to the flowing current, and energy release or absorption with respect to the surroundings are taken into account. The coil resistance can thereby be ascertained very precisely and taken into consideration in the triggering.

A further improvement of the temperature simulation is yielded when first filter 200 is composed of two parallel-connected filters having different time behaviors. This refinement is shown with dotted lines in FIG. 2.

In this case, one filter takes into account the heat transfer of the load with respect to its surroundings, and the second filter takes into account the heat transfer to the medium flowing through the load, such as a hydraulic fluid. At the same time, the time constants allow for the different transfer behaviors of the energy to the outside and to the traversing medium, respectively. Preferably a sensor 147 supplies a signal TU with respect to the ambient temperature, and a sensor 147*b* supplies a signal TUb with respect to the temperature of the medium flowing through the solenoid valve.

Filter 200, which characterizes the transfer behavior to the outside, preferably has a large time constant; filter 200*b*, which characterizes the transfer behavior to the traversing medium, has a very short time constant, i.e. temperature changes of the traversing medium very quickly have an effect on winding temperature TW. On the other hand, changes in the ambient temperature take effect very slowly but substantially more strongly on the coil temperature.

This procedure allows for the fact that the solenoid valve does not have a homogeneous construction. The heat transfer from the coil winding via the outer casing is different from the heat transfer between the coil winding and the inner channel which is washed through by the traversing medium. Still further different heat transfers can be considered in further refinements.

What is claimed is:

1. A method for controlling an electrical load, comprising:

ascertaining a quanitity, the quantity at least one of (a) being a function of a temperature of the load and (b) characterizing the temperature of the load, the quantity being specifiable on the basis of a temperature variable and a current variable; and controlling the load taking into account an influence of the temperature variable on the quantity in a first filter and taking into account an influence of a current flowing through the load in a second filter.

2. The method according to claim 1, wherein at least one of the first and second filters has at least PT1 behavior.

3. The method according to claim 1, wherein the first filter includes at least two parallel-connected filters with T1 behavior, and the two parallel-connected filters have different time behavior.

4. The method according to claim 1, wherein the second filter simulates an intrinsic heating of the load.

5. The method according to claim 1, wherein the temperature variable characterizes at least one of a temperature of the surroundings and a temperature of a medium flowing through the load.

6. The method according to claim 1, wherein the first filter simulates an exchange with at least one of (a) the surroundings and (b) a medium flowing through the load.

7. The method according to claim 1, wherein the quantity is one of the temperature of the load and an ohmic resistance of the load.

8. A device for controlling an electrical load, comprising:

means for ascertaining a quantity, the quantity at least one of (a) being a function of a temperature of the load and (b) characterizing the temperature of the load, the quantity being specifiable on the basis of a temperature variable and a current variable, the means for ascertaining including a first filter that takes into account an influence of the temperature variable on the quantity, the means for ascertaining further including a second filter that takes into account an influence of a current flowing through the load.

* * * * *